(12) United States Patent
Chang et al.

(10) Patent No.: US 7,760,144 B2
(45) Date of Patent: Jul. 20, 2010

(54) ANTENNAS INTEGRATED IN SEMICONDUCTOR CHIPS

(75) Inventors: Chung-Long Chang, Dou-Liu (TW); David Ding-Chung Lu, Hsin-Chu (TW); Shine Chung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

(21) Appl. No.: 12/185,591

(22) Filed: Aug. 4, 2008

(65) Prior Publication Data
US 2010/0026601 A1    Feb. 4, 2010

(51) Int. Cl.
*H01Q 1/38* (2006.01)
*H01Q 1/24* (2006.01)

(52) U.S. Cl. .................. 343/700 MS; 343/702; 343/895; 343/873; 343/732; 340/572.7

(58) Field of Classification Search .................. None
See application file for complete search history.

(56) References Cited

U.S. PATENT DOCUMENTS

| | | | |
|---|---|---|---|
| 6,344,824 B1 * | 2/2002 | Takasugi et al. | ...... 343/700 MS |
| 6,424,315 B1 | 7/2002 | Glenn et al. | |
| 7,142,682 B2 | 11/2006 | Mullenborn et al. | |
| 2007/0176845 A1 * | 8/2007 | Yamazaki et al. | ........... 343/895 |
| 2008/0246664 A1 * | 10/2008 | Ikemoto et al. | ....... 343/700 MS |
| 2008/0252531 A1 * | 10/2008 | Hanaoka et al. | ....... 343/700 MS |
| 2008/0291092 A1 * | 11/2008 | Matsunaga | ........... 343/700 MS |
| 2009/0278747 A1 * | 11/2009 | Al-Mahdawi | ........ 343/700 MS |

* cited by examiner

*Primary Examiner*—Trinh V Dinh
(74) *Attorney, Agent, or Firm*—Slater & Matsil, L.L.P.

(57) ABSTRACT

An integrated circuit structure includes a semiconductor chip including a top surface, a bottom surface, and a side surface; a metal seal ring adjacent the side surface; and an antenna including a seal-ring antenna. The seal-ring antenna includes at least a portion of the metal seal ring.

22 Claims, 13 Drawing Sheets

ANTENNAS INTEGRATED IN SEMICONDUCTOR CHIPS

TECHNICAL FIELD

This invention relates generally to integrated circuits, and more particularly to antennas integrated in semiconductor chips.

BACKGROUND

More and more modern applications require the use of antennas. The applications include wireless communication devices such as mobile phones and other portable devices sending and/or receiving wireless signals. Recently, RFID integrated circuit tags were developed, and are gaining popularity. A common feature of these devices is portability, which demands these devices to be small. Therefore, integrated antennas are formed in the same semiconductor chips as other integrated circuits are developed.

Figure 1:
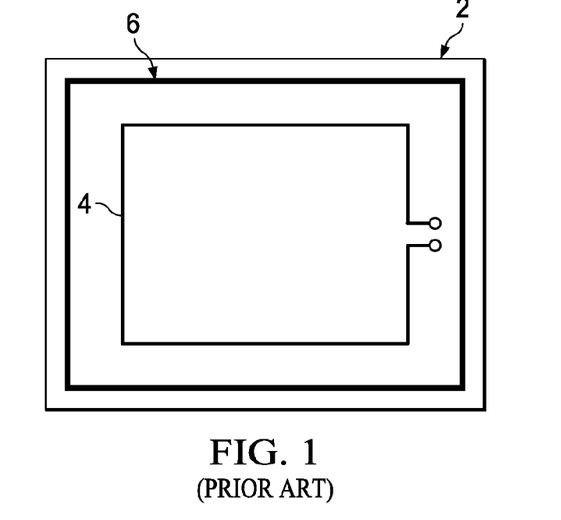
FIG. 1 illustrates a conventional integrated circuit structure including an antenna integrated in a semiconductor chip.

FIG. 1 illustrates a top view of a conventional integrated circuit structure, which includes antenna 4 formed in semiconductor chip 2. The conventional antenna 4, however, suffers from drawbacks. First, partially due to the large area antenna 4 requires, and the spacing required for separating antenna 4 from other integrated circuits in semiconductor chip 2, antenna 4 requires a large chip area. In addition, seal ring 6 is close to the edges of semiconductor chip 2, and hence encircles antenna 4. Seal ring 6 has the side effect of reflecting and isolating the signal received/sent by antenna 4. Accordingly, antenna 4 can only effectively receive or send signals in the direction vertical to the surface of semiconductor chip 2. This significantly reduces the efficiency of antenna 4. As compensation, antenna 4 may need to be enlarged in order to achieve the required signal strength.

Accordingly, what is needed in the art is a new antenna structure with greater efficiency, and occupying a smaller chip area.

SUMMARY OF THE INVENTION

In accordance with one aspect of the present invention, an integrated circuit structure includes a semiconductor chip including a top surface, a bottom surface, and a side surface; a metal seal ring adjacent the side surface; and an antenna, including a seal-ring antenna. The seal-ring antenna includes at least a portion of the metal seal ring.

In accordance with another aspect of the present invention, an integrated circuit structure includes a semiconductor chip including a top surface, a bottom surface, and a side surface; a semiconductor substrate in the semiconductor chip; an active circuit at a top surface of the semiconductor substrate; a plurality of metallization layers over the active circuit and the semiconductor substrate, wherein the plurality of metallization layers includes a top metallization layer and a bottom metallization layer; and an antenna having a seal-ring antenna adjacent the side surface. Substantially no metal features electrically disconnected from the antenna are formed between the seal-ring antenna and the side surface. The antenna is electrically connected to the active circuit.

In accordance with yet another aspect of the present invention, an integrated circuit structure includes a semiconductor chip including a top surface, a bottom surface, and a side surface; a semiconductor substrate in the semiconductor chip; an active circuit at a top surface of the semiconductor substrate; a plurality of metallization layers over the active circuit and the semiconductor substrate, wherein the plurality of metallization layers includes a top metallization layer and a bottom metallization layer; and an antenna electrically connected to the active circuit. The antenna includes a seal-ring antenna adjacent to the side surface and extending across substantially an entire length of the side surface. Substantially no metal features electrically disconnected from the antenna are between the seal-ring antenna and the side surface. The antenna further includes a front-side antenna on an inner side of the semiconductor chip, wherein the front-side antenna is electrically connected to the seal-ring antenna. The integrated circuit structure further includes a conductive reflector between the antenna and the active circuit, wherein the conductive reflector is electrically floating.

The advantageous features of the present invention include reduced chip area usage for antennas and improved reception of signals.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3C through 13 are views of the embodiments of the present invention; and

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel antennas integrated in semiconductor chips are provided. Throughout the various views and illustrative embodiments of the present invention, like reference numbers are used to designate like elements. It is noted that the figures of the present application may not have accurate scales as in actual semiconductor chips. Particularly, the thicknesses of the semiconductor chips may be exaggerated in order to show vertical structures clearly.

Figure 2:
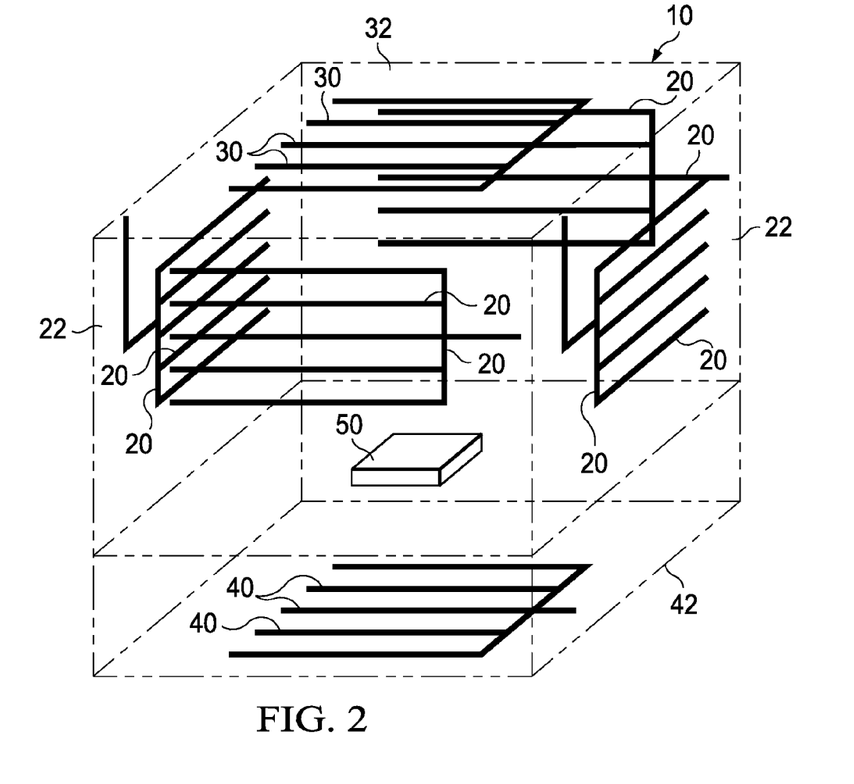
FIGS. 2, 3A and 3B illustrate a perspective view, a top view, and a cross-sectional view, respectively, of an embodiment of the present invention, wherein seal-ring antennas are formed in a semiconductor chip.

FIG. 2 illustrates a perspective view of an embodiment of the present invention. Semiconductor chip 10 includes top surface 32, bottom surface 42, and side surfaces (edges) 22. In practical case, the thickness (vertical dimension) of semiconductor chip 10 is typically much smaller than horizontal dimensions. Front-side antenna 30 is formed close to the top surface 32 of semiconductor chip 10, and may extend from a top metallization layer (referred to as "Mtop" hereinafter) to underlying metallization layers (referred to as "Mtop-1," "Mtop-2," and the like). Backside antenna 40 is close to the back surface 42 of semiconductor chip 10. Seal-ring antennas 20 use at least a portion of, and possibly all of, the seal ring of semiconductor chip 10. It is appreciated that the antennas shown in FIG. 2 are merely symbols, and the detailed structures are discussed in subsequent paragraphs.

As is known in the art, seal rings are typically formed close to the edges, and often along the parameter, of semiconductor chips. Conventional seal rings may extend from the bottom metallization layer (referred to as "M1" hereinafter) through the top metallization layer Mtop. Accordingly, seal-ring antennas 20 may have a vertical structure, with metal lines extending through a plurality of metallization layers, and close to side surfaces 22 of semiconductor chip 10.

Seal-ring antennas 20, front-side antennas 30, and backside antennas 40 may be electrically interconnected, for example, by metal lines, vias, and/or through-silicon vias (TSV). Further, they are connected to integrated circuit 50 formed inside semiconductor chip 10, wherein the integrated circuit 50 may include buffers, drivers, logic or core circuits, memory devices, and the like. Integrated circuit 50 may include active devices (and hence may also be referred to as "active circuit 50" hereinafter) such as transistors, and passive devices such as capacitors, resistors, inductors, and the like. Further, integrated circuit 50 may include radio frequency (RF) circuits for processing RF signals, and mixed-mode circuits, which may be used to process low-frequency signals. The interconnection between seal-ring antennas 20, front-side antenna 30, backside antenna 40, and integrated circuit 50 are shown as dotted lines.

Figure 3A:
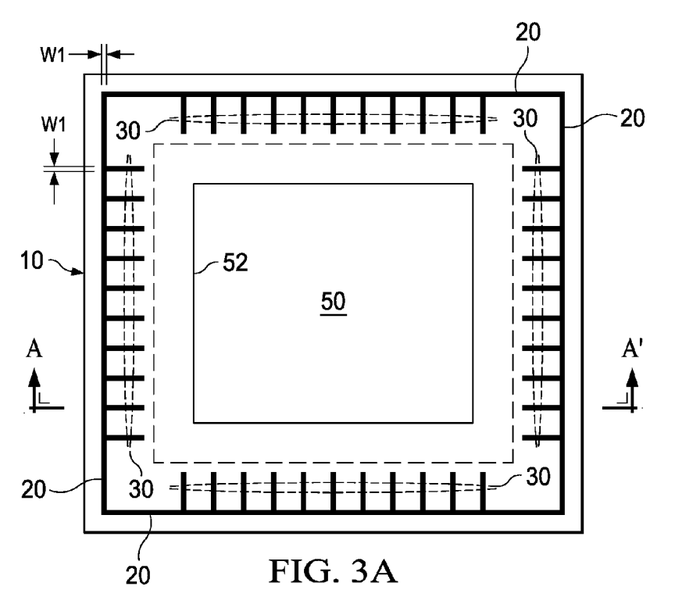

FIG. 3A illustrates a top view of an embodiment of the present invention, in which seal-ring antenna 20 and front-side antennas 30 are illustrated. In the top view, seal-ring antenna 20 is also a normal seal ring that has four sides forming a closed loop, wherein each of the sides of seal-ring antenna 20 is adjacent to an edge of semiconductor chip 10. Preferably, substantially no metal features are formed between seal-ring antenna 20 and the respective edges of the semiconductor chip 10. Front-side antennas 30 are electrically connected to seal-ring antenna 20. In the illustrated embodiment as shown in FIG. 3A, front-side antennas 30 are continuously connected to seal-ring antenna 20 (please refer to FIG. 3B), with no noticeable boundaries. In other embodiments, front-side antennas 30 and seal-ring antenna 20 may be separated from each other. However, as shown in FIG. 4B, metal lines 41 and vias may be used to electrically connect front-side antennas 30 to seal-ring antenna 20.

Figure 3B:
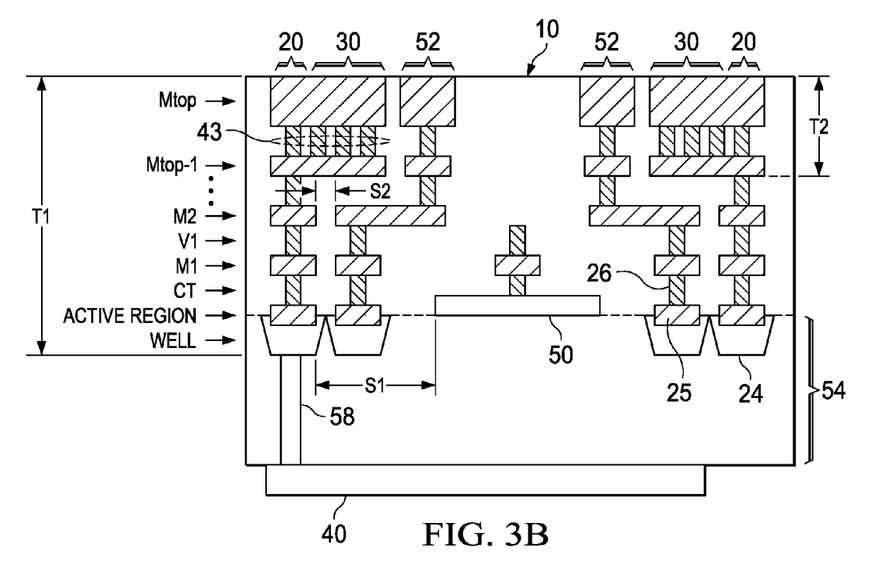

FIG. 3B illustrates a cross-sectional view of the structure shown in FIG. 3A, wherein the cross-sectional view is taken along a plane crossing line A-A'. In this embodiment, seal-ring antenna 20 extends all the way from the top metallization layer Mtop to the bottom metallization layer M1. Seal-ring antenna 20 may further be connected to well region 24 and active regions 25 through contact plugs 26, wherein active regions 25 and well region 24 are in substrate 54. Alternatively, seal-ring antennas 20 only include upper layers of the seal ring, while the portion of the seal ring in lower metallization layers, for example, layers M1, M2, or the like, are disconnected from the overlying portions. An exemplary embodiment is similar to what is shown in FIG. 3B, except vias V1 in seal-ring antennas 20 are not formed.

Each of the seal-ring antenna 20 and front-side antennas 30 may include metal lines 41 in metallization layers, and vias connecting metal lines 41. Also, metal lines 41 in seal-ring antenna 20 and front-side antennas 30 may be interconnected through multiple vias, so that the resistances between metal lines 41 are reduced. An example of the multiple vias 43 (also referred to as redundant vias) is shown in FIG. 3B. The multiple vias 43 may form a via array if viewed from top, and FIG. 3B only illustrates one row or one column of the multiple vias 43. Alternatively, metal lines 41 in the seal-ring antenna 20 and front-side antennas 30 may be interconnected through via walls (also referred to as trench vias), wherein each of the via walls may have a length and a width substantially the same as that of the overlying and/or underlying metal lines 41. Although not shown, dielectric layer(s) may be formed to cover top metallization layer Mtop, wherein the dielectric layer(s) may include passivation layer(s).

The top metallization layer Mtop (and possibly layer Mtop-1) may be formed of aluminum, copper, or the like, and may be the same metal layer as contact pads (not shown, referred to as "contact pad layer" hereinafter). Alternatively, the top metallization layer Mtop may be lower than the contact pad layer. The metallization layers underlying layer Mtop may be formed of copper, using, for example, damascene processes. Alternatively, aluminum may be used.

The layers of front-side antennas 30 may be formed simultaneously with the corresponding layers of seal-ring antennas 20. In the preferred embodiment, front-side antennas 30 are only in several upper metallization layers such as Mtop, Mtop-1, or the like, while lower metallization layers such as M1, M2, or the like, are not used to form front-side antennas 30. Preferably, the width WI (refer to FIG. 3A) of front-side antennas 30 and seal-ring antennas 20 are greater than about 2 μm. The thickness T1 of seal-ring antennas 20 and thickness T2 of front-side antennas 30 (FIG. 3B) are preferably greater than about 8 kÅ.

FIGS. 3A and 3B also illustrate integrated circuit 50 formed in semiconductor chip 10, wherein the integrated circuit 50 is horizontally spaced apart from front-side antennas 30 and seal-ring antennas 20. The horizontal spacing S1 between integrated circuit 50 (and/or any other integrated circuits in semiconductor chip 10) and seal-ring antennas 20 is preferably greater than about 2 μm. Reflector 52 is formed to separate integrated circuit 50 from seal-ring antennas 20 and front-side antennas 30. Reflector 52 reflects the RF signal received or sent by the antennas, so that the signal strength may be improved. Further, reflector 52 acts as an isolator to prevent the RF signal from affecting the operation of integrated circuit 50, and to prevent the signal loss in substrate 54. Accordingly, the length L1 (refer to FIG. 7A) of reflector 52 is preferably great enough, so that the direct signal paths between the antennas 20/30 and integrated circuit 50 are blocked. Length L1 is preferably greater than the length L2 of antennas 20/30, and/or length L3 of integrated circuit 50. Reflector 52 is electrically floating, with spacing S2 between antennas 20/30 and reflector 52 being greater than about 2000 Å. Reflector 52 may also extend from the top metallization layer Mtop into well regions in semiconductor substrate 54. Although only one reflector 52 is shown, more layers of reflectors may be formed, wherein each layer of the reflector may be electrically and physically separated from others.

Figure 3C:
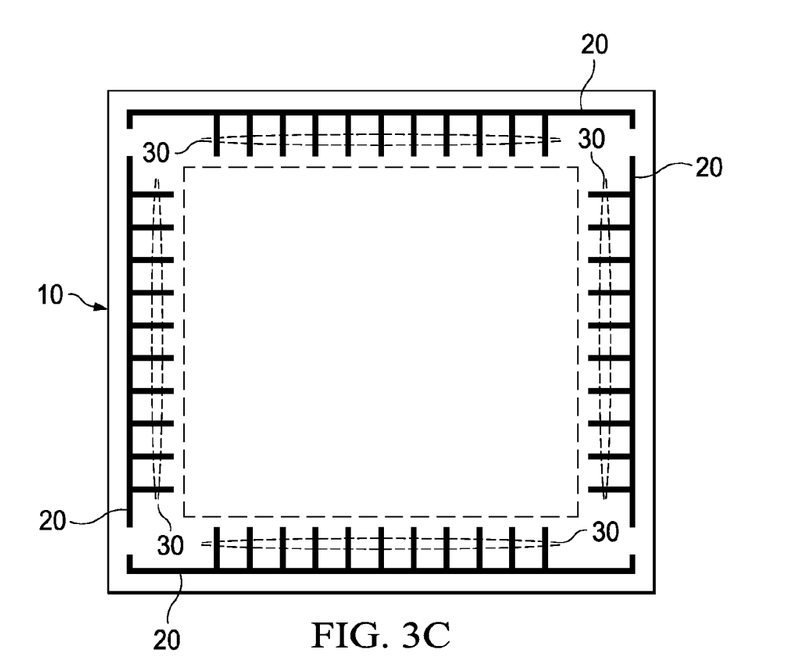
Figure 3D:
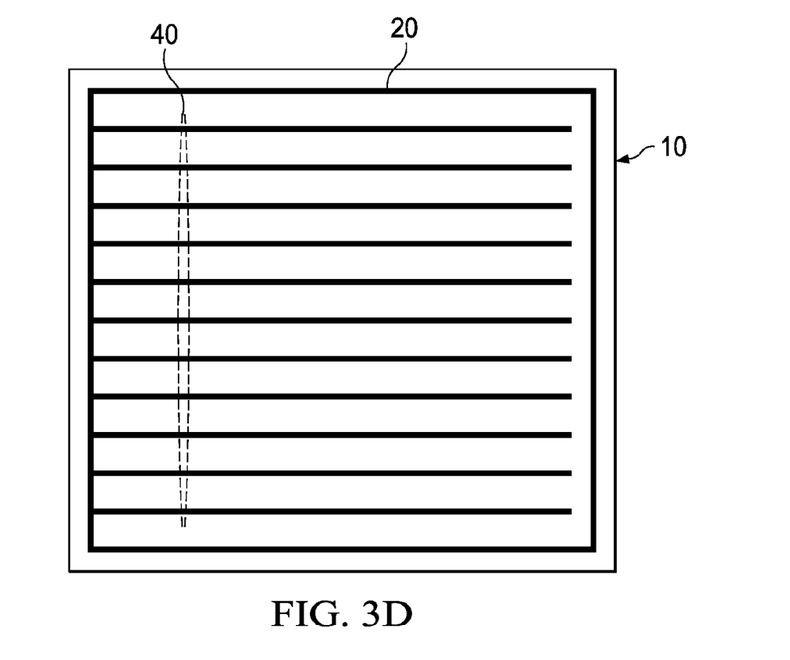
Figure 3E:
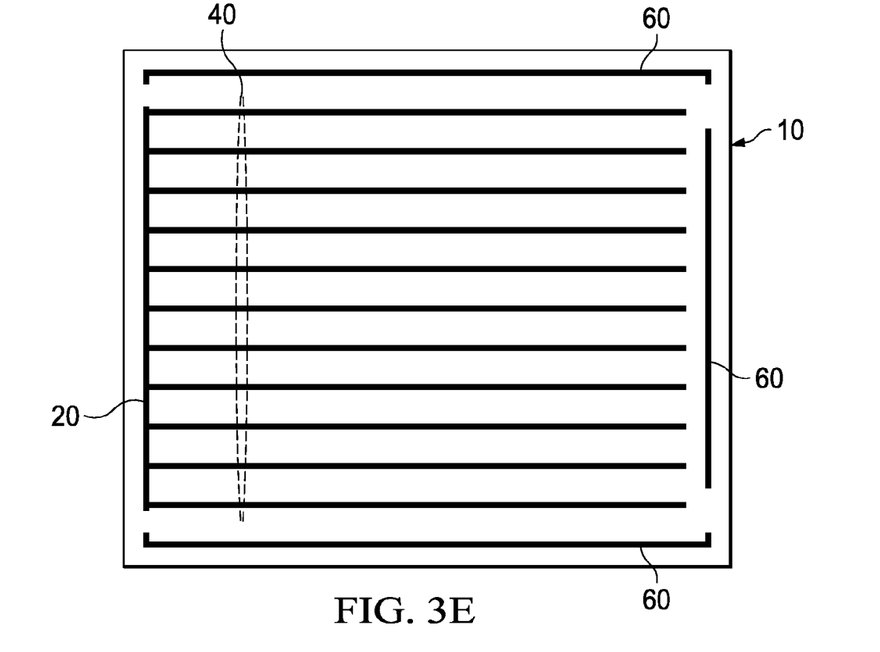

FIGS. 3C, 3D, and 3E are top views of variations of the present invention. In FIG. 3C, a seal-ring is segmented into disconnected portions, with one or more portion acting as seal-ring antenna 20. FIGS. 3D and 3E illustrate backside antennas 40. Since the backside of semiconductor chip 10 does not have contact pads, backside antenna 40 may occupy substantially an entire back surface of semiconductor chip 10, although they may be smaller. In FIG. 3D, seal-ring antenna 20 forms a closed loop. In FIG. 3E, a seal ring is segmented into separated (segmented) portions, with some portions acting as seal-ring antennas 20, while other portions 60 not included in any seal-ring antennas. The interconnection between seal-ring antenna(s) 20 and backside antenna 40 may include through-silicon vias (TSV) 58, which is shown in FIG. 3B.

Figure 4A:
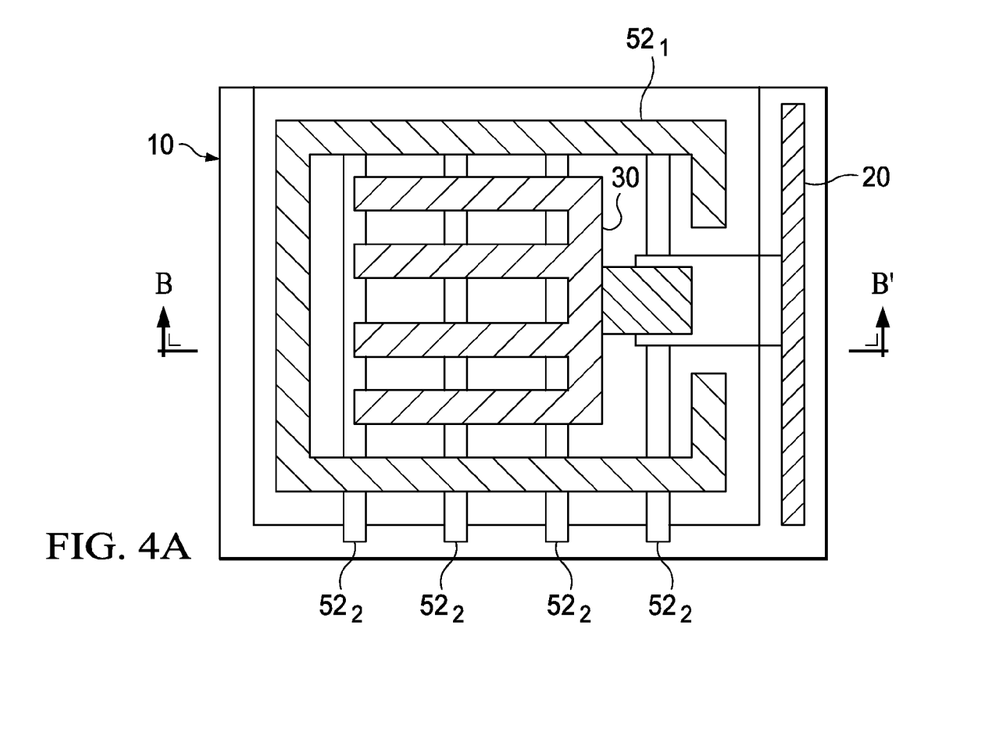
Figures 4B, 5A:
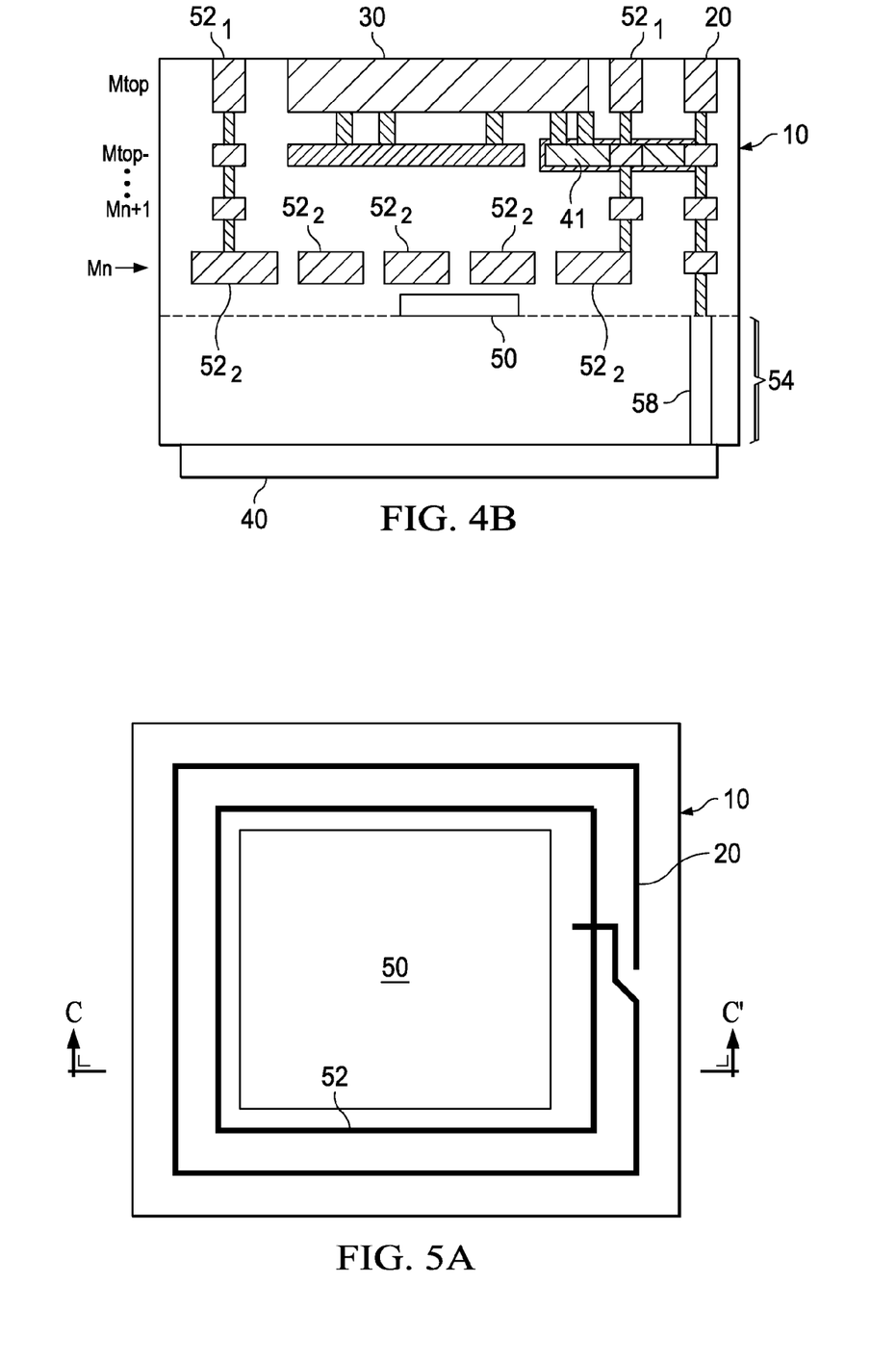

Referring to FIGS. 4A and 4B, front-side antennas 30 may be physically separated from seal-ring antenna 20. FIG. 4A illustrates a top view, wherein front-side antenna 30 is spaced apart from seal-ring antenna 20, with reflector 52 substantially encircling front-side antenna 30. Front-side antenna 30 is connected to seal-ring antenna 20 (or integrated circuit 50) through metal lines 41 and/or vias through an opening in reflector 52 (FIG. 4B).

FIG. 4B illustrates a cross-sectional view of the structure shown in FIG. 4A, wherein the cross-sectional view is taken along a plane crossing line B-B'. It is noted that reflector 52 may include sidewall portions $52_1$, and bottom portions $52_2$. Sidewall portions $52_1$ may be formed using similar methods, and have a similar structure as, seal-ring antenna 20. For process reasons, bottom portions $52_2$ preferably do not form a continuous plate. Rather, bottom portions $52_2$ include isolated and electrically floating portions. In an embodiment, bottom portions $52_2$ include isolated strips, as shown in FIG. 4A. In other embodiments, bottom portions $52_2$ may form arrays or other patterns. Bottom portions $52_2$ may be formed in any of the metallization layers between the overlying antenna (which may include front-side antenna 30 and a portion of seal-ring antennas 20). More preferably, bottom portions $52_2$ are under the overlying antenna and over metal lines 41 connected to integrated circuit 50.

Figure 5B:
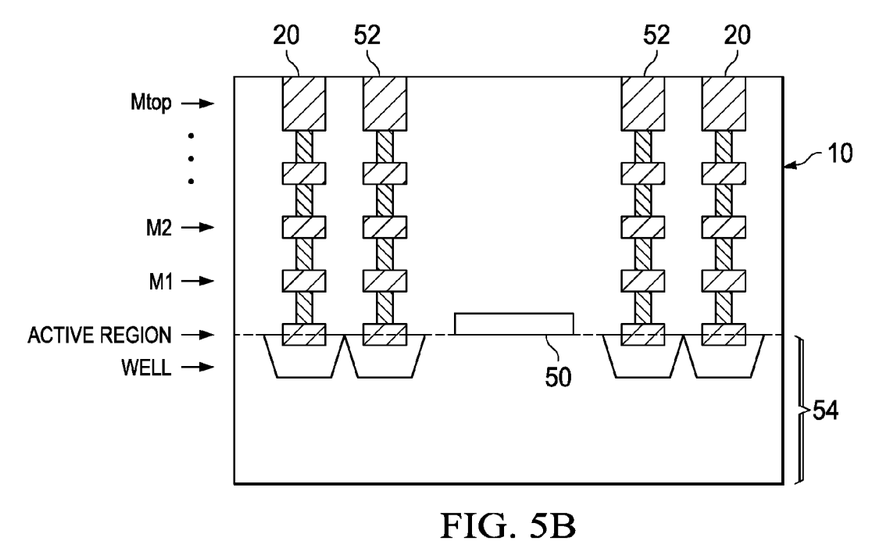
Figure 6A:
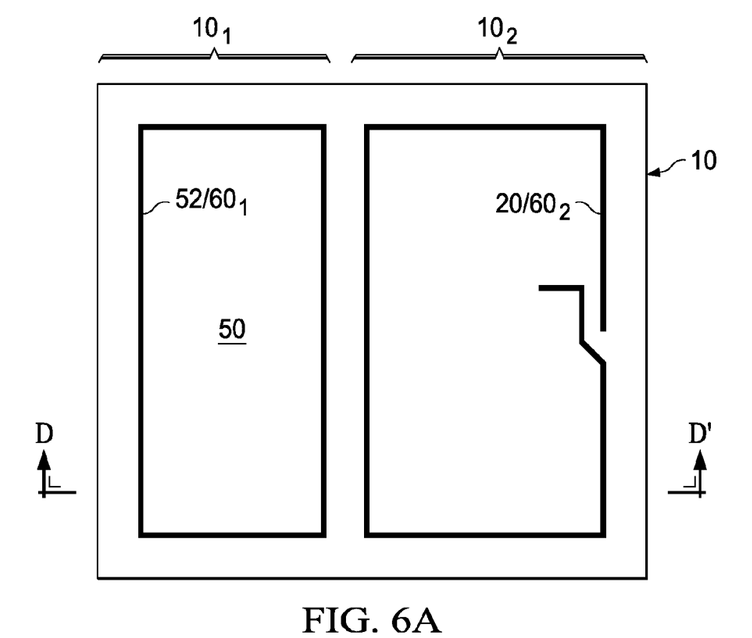
Figure 6B:
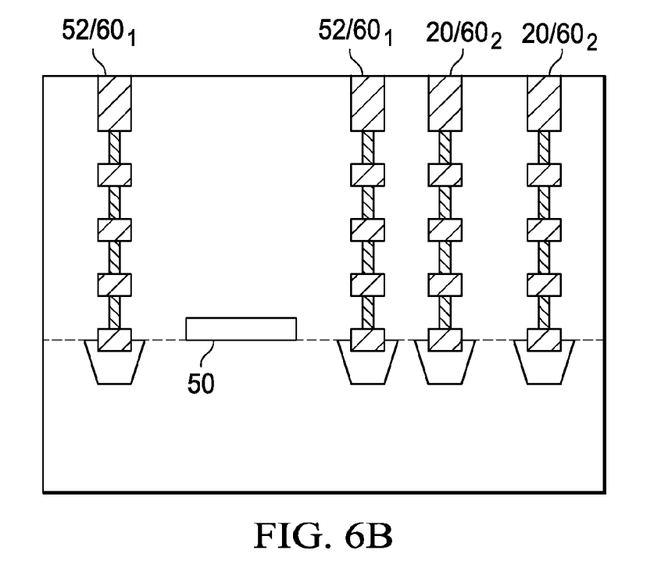

FIGS. 5A and 5B illustrate a top view and a cross-sectional view, respectively, of an embodiment, wherein FIG. 5B is taken along a plane crossing line C-C' in FIG. 5A. Seal-ring antenna 20 is formed outside of integrated circuit 50, with reflector 52 therebetween. FIGS. 6A and 6B illustrate yet another embodiment of the present invention, wherein FIG. 5B is taken along a plane crossing line D-D' in FIG. 6A. In this embodiment, integrated circuit 50 and RF components, such as seal-ring antenna 20, are formed in different regions of semiconductor chip 10. This embodiment is equivalent to having two semiconductor chips $10_1$ and $10_2$ in semiconductor chip 10, each having their own seal rings $60_1$ and $60_2$, except semiconductor chips $10_1$ and $10_2$ are not sawed apart. In this embodiment, seal ring $60_2$ also acts as seal-ring antenna 20, while seal ring $60_1$ also acts as reflector 52.

Figure 7A:
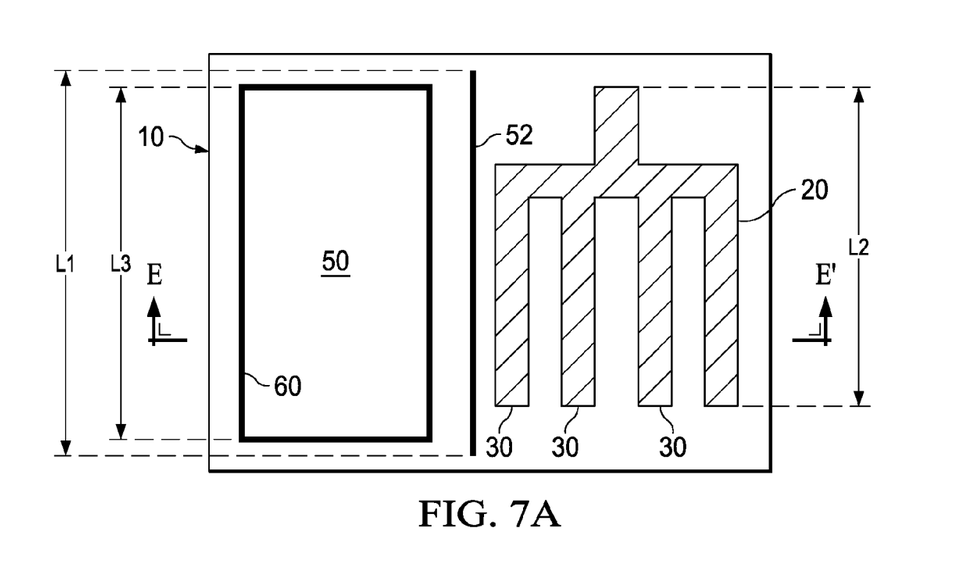
Figure 7B:
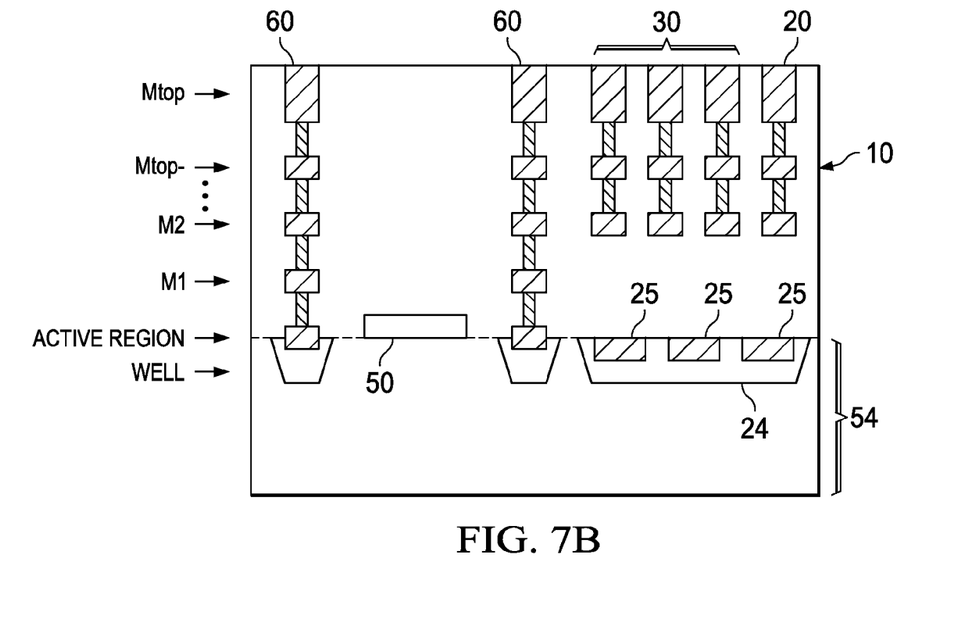

FIG. 7A illustrates a top view of an antenna, with the antenna direction being vertical to the top surface of the respective semiconductor chip 10. The cross-sectional view of the structure is shown in FIG. 7B, wherein the cross-sectional view is taken along a plane crossing line E-E' in FIG. 7A. In this embodiment, the portion of the seal ring 60 between antenna 20/30 and integrated circuit 50 acts as a reflector, although an extra reflector 52 may be added. In addition, well regions (and active regions) 24/25 are formed in substrate 54 to reflect the signal, and to prevent signal loss in substrate 54.

Figure 8A:
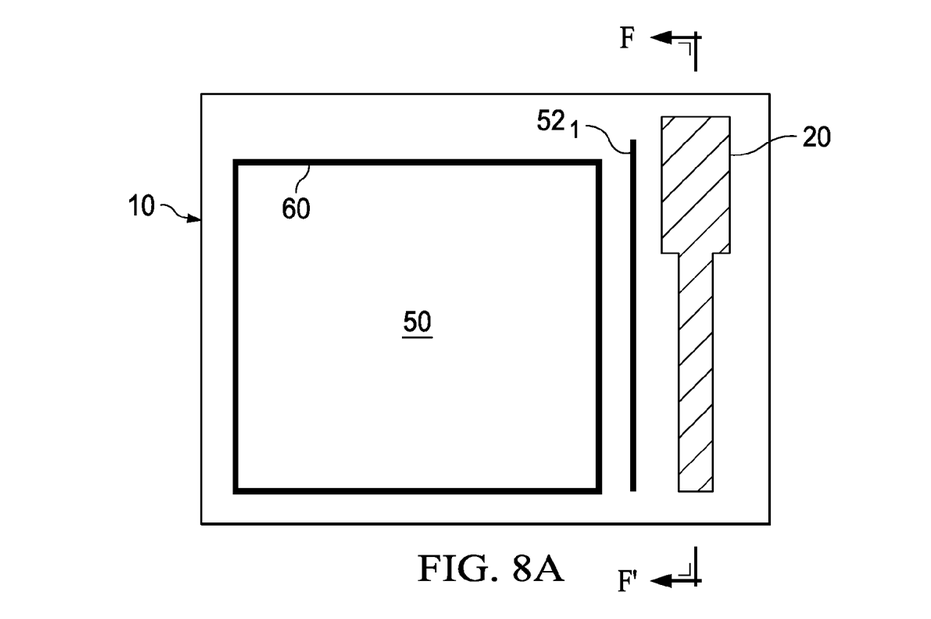
Figure 8B:
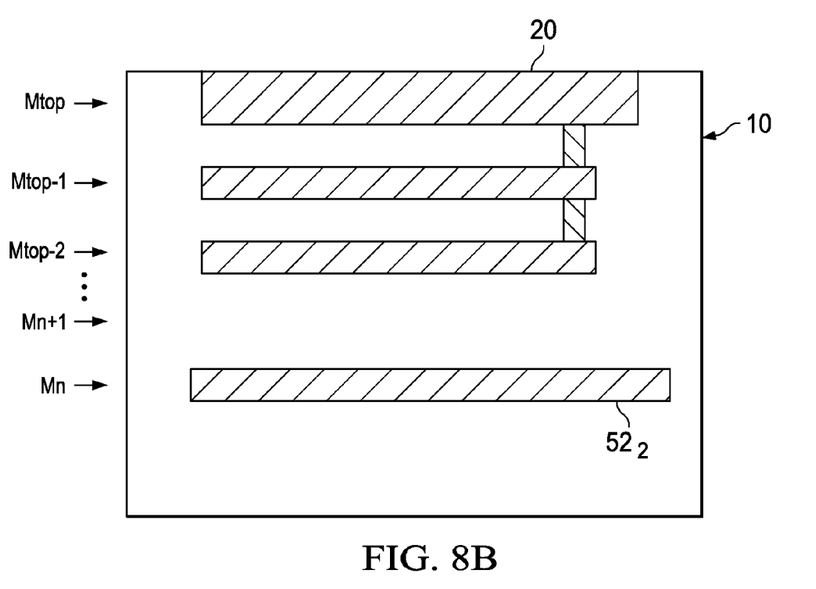

FIGS. 8A and 8B illustrate seal-ring antenna 20 having an antenna direction parallel to a side surface of semiconductor chip 10. Again, FIG. 8A illustrates a top view, while FIG. 8B illustrates a cross-sectional view taken along a plane crossing line F-F'. FIG. 8B shows that reflector portion $52_2$ is formed underlying seal-ring antenna 20 to reflect signal. Reflector portion $52_1$ may be integrated with other portions of seal ring 60 to form a closed loop encircling integrated circuit 50, or separated from seal ring 60, as is shown in FIG. 8A.

Figure 9:
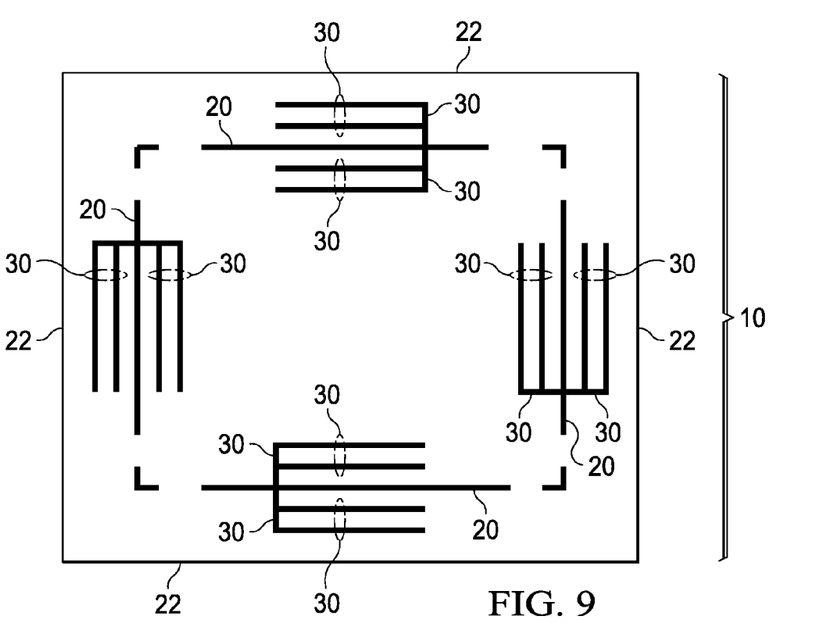
Figure 10:
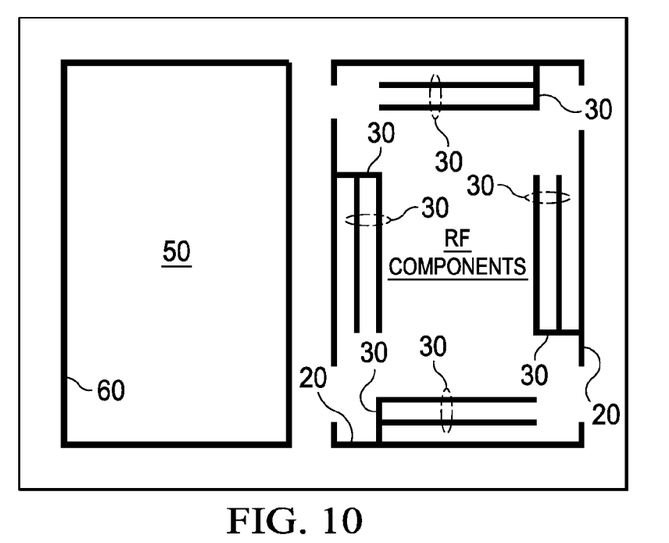
Figure 11:
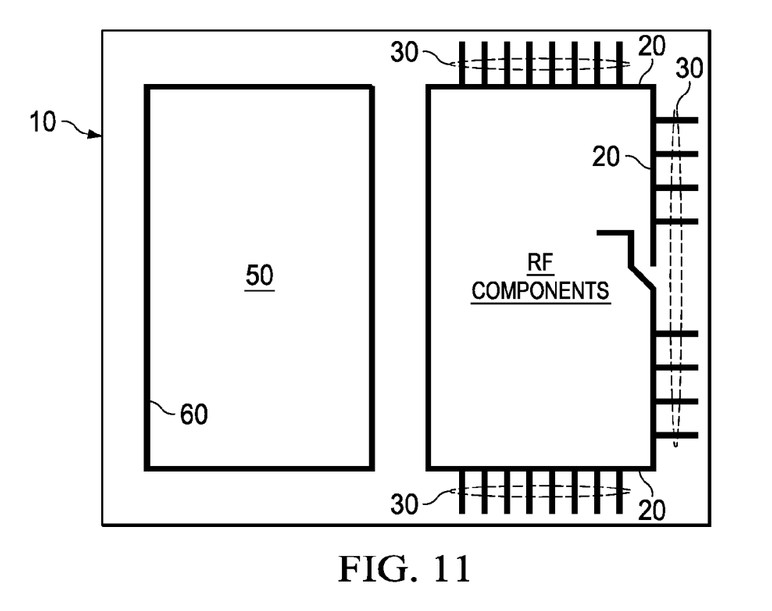
Figure 12:
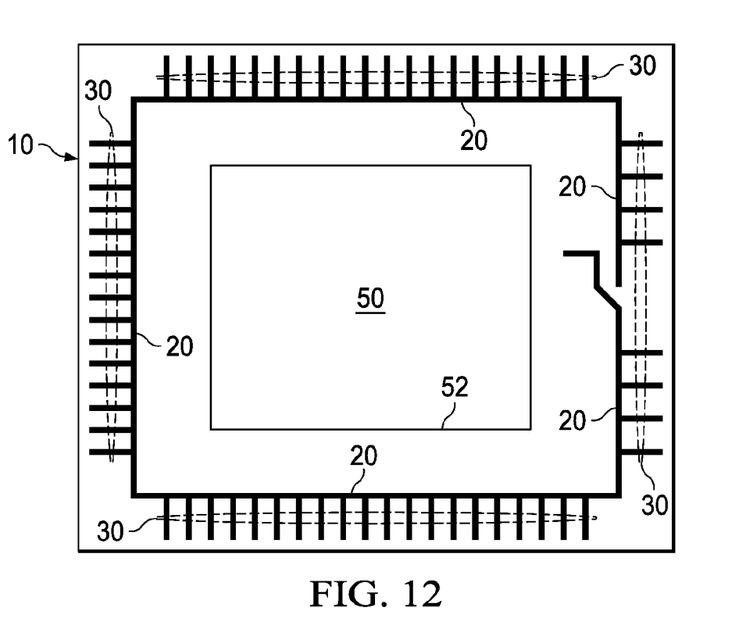
Figure 13:
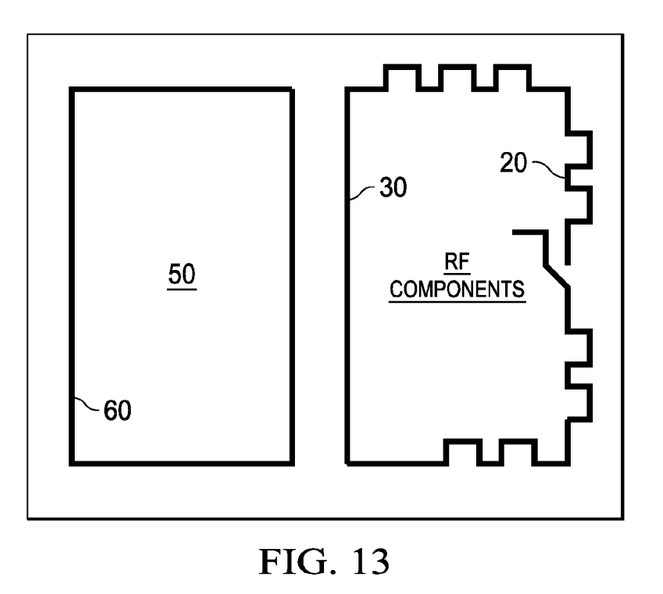

It is realized that seal rings may be used as seal-ring antennas in different ways. In FIG. 9, front-side antennas 30 may have portions on the inner side (closer to integrated circuit 50), and portions on the outer side (closer to side surfaces 22 of semiconductor chip 10), of seal-ring antennas 20. In this case, the portions on the outer side of seal-ring antennas 20 may be considered as being an extension of seal-ring antennas 20. In FIG. 10, integrated circuit 50 and RF components are formed in separated regions, each having their own seal rings. Front-side antennas 30 are formed on the inner side of, and connected to, seal-ring antenna 20. Conversely, in FIG. 11, front-side antennas 30 are formed on the outer side of, and connected to, seal-ring antenna 20. In FIG. 12, front-side antennas 30 are formed on the outer side of seal-ring antenna (s) 20. In FIG. 13, seal-ring antenna 20 has a zigzag pattern, so that the length of seal-ring antenna 20 may be increased.

It is appreciated that conventional semiconductor chips may include one or two seal rings (often referred to as main seal ring and sacrificial seal ring). In the embodiments of the present invention, in addition to seal-ring antennas 20 that are shown in the illustrated figures, an additional seal ring (not shown) may be formed. The additional seal ring may be formed on the inner side of seal-ring antennas 20, and may act as a seal ring only, but not an antenna. Alternatively, the additional seal ring has at least a portion acting as a portion of an additional seal-ring antenna (not shown).

Figure 14:
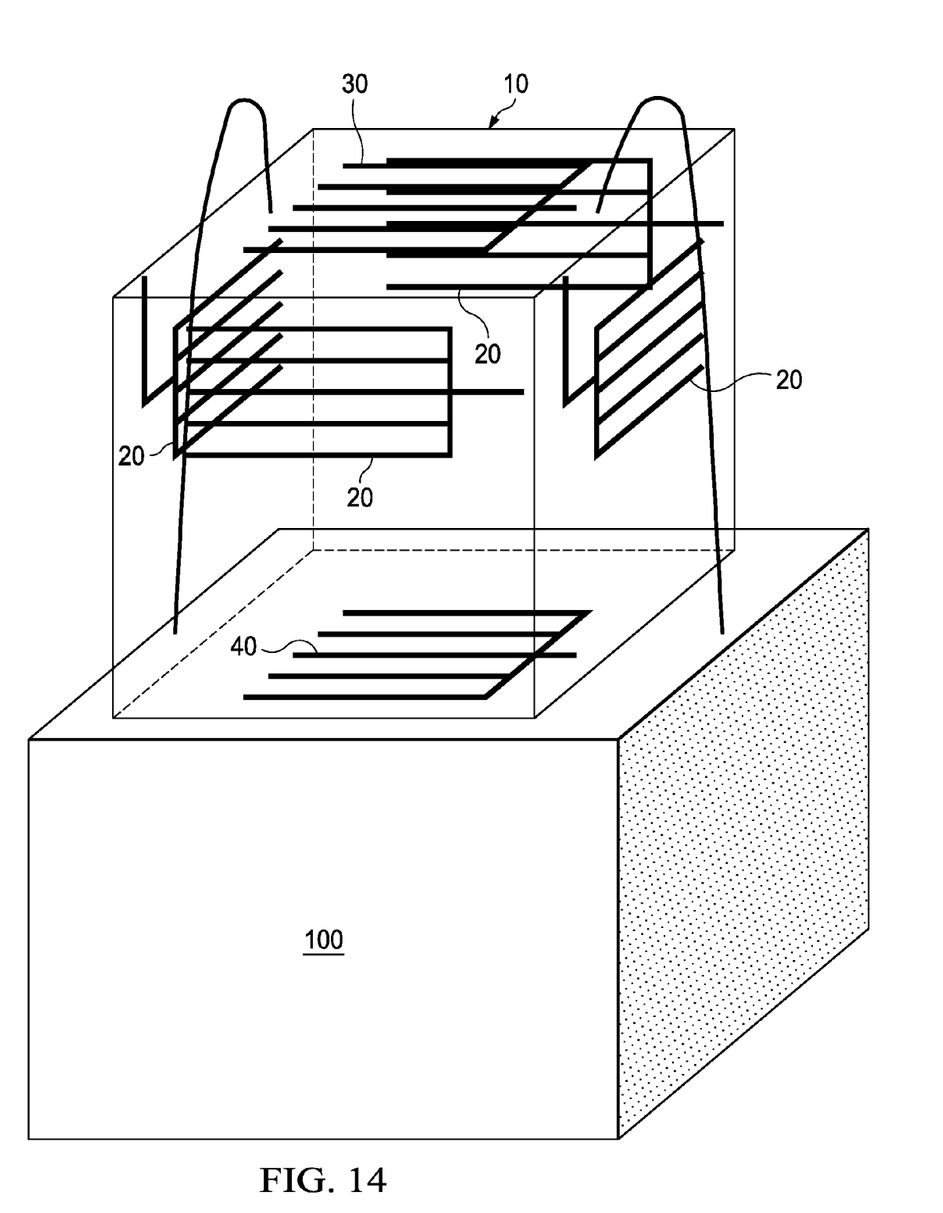
FIGS. 14 and 15 illustrate system-in-package applications, wherein the semiconductor chips including integrated antennas are packaged with other semiconductor chips.
Figure 15:
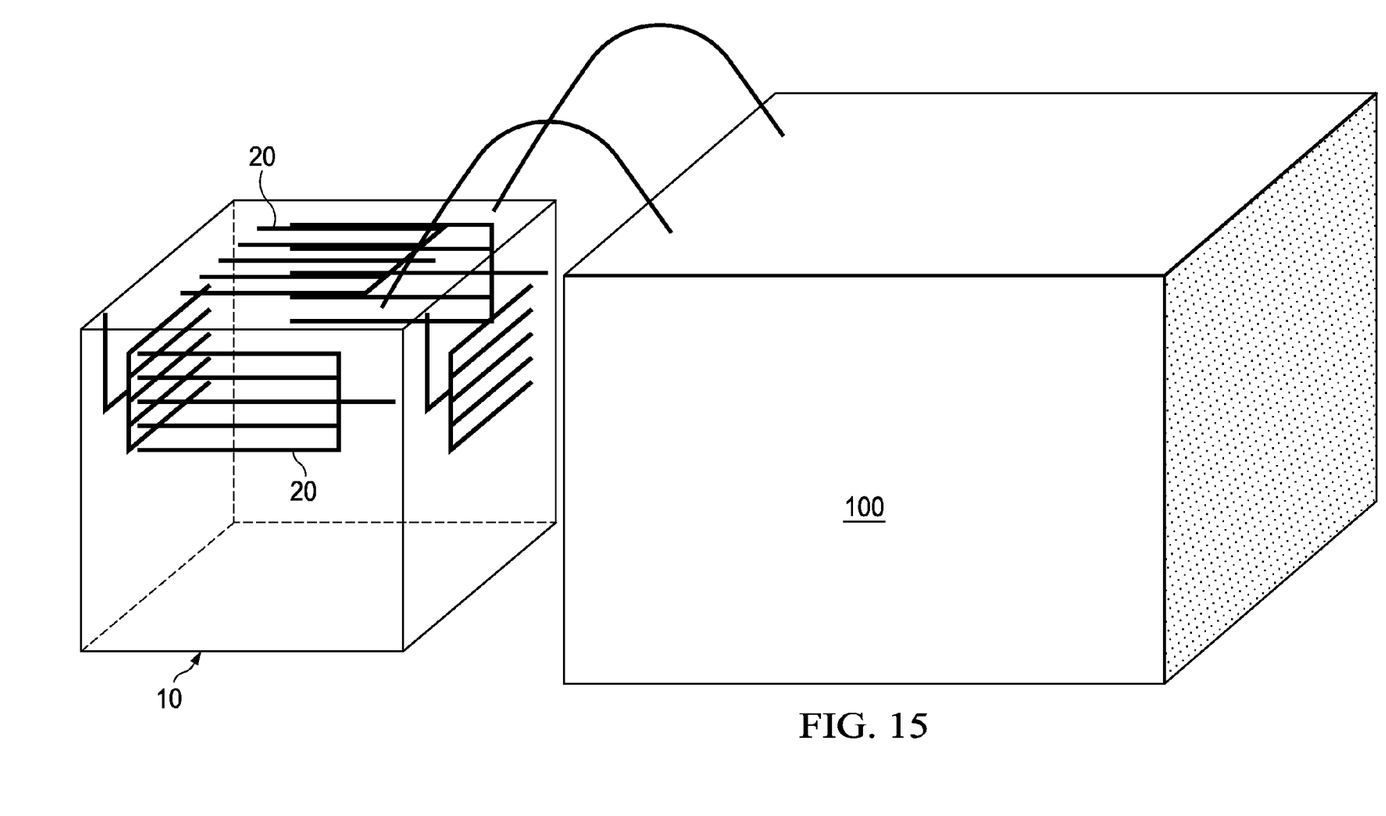

The integrated antennas including seal-ring antennas 20 are readily available for the system-in-package (SIP) applications. Referring to FIG. 14, semiconductor chip 10, which includes seal-ring antenna 20, front-side antennas 30, and/or backside antennas 40, is stacked on semiconductor chip 100. In this embodiment, critical-design circuits, which may have a high speed, may be located in semiconductor chip 100, while the circuits related to the processing of RF signals may be located in semiconductor chip 10. TSVs (not shown in FIG. 14) may be used to connect the circuits in semiconductor chip 10 to its backside, and to semiconductor chip 100. FIG. 15 illustrates an additional SIP package, with semiconductor chips 10 and 100 bonded through wire bonding.

The embodiments of the present invention have several advantageous features. First, with seal rings used as antennas, the large chip area that otherwise will be used for forming antennas is saved. Second, seal-ring antennas are not encircled by other conductive features, and hence can receive (or send) signals from edges, and even the bottom, of the respective semiconductor chips. The signal strength is thus improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor chip comprising a top surface, a bottom surface, and a side surface;
   a semiconductor substrate in the semiconductor chip;
   an active circuit at a top surface of the semiconductor substrate;

a plurality of metallization layers over the active circuit and the semiconductor substrate, wherein the plurality of metallization layers comprises a top metallization layer and a bottom metallization layer; and an antenna in the semiconductor chip having a seal-ring antenna adjacent the side surface of the semiconductor chip, wherein substantially no metal feature which is electrically disconnected from the antenna is formed between the seal-ring antenna and the side surface of the semiconductor chip, and wherein the antenna is electrically connected to the active circuit.

2. The integrated circuit structure of claim 1, wherein the seal-ring antenna extends from the top metallization layer to the bottom metallization layer.

3. The integrated circuit structure of claim 1, wherein the seal-ring antenna comprises metal lines in the top metallization layer, and is disconnected from metal lines in the bottom metallization layer.

4. The integrated circuit structure of claim 1, wherein the antenna further comprises a front-side antenna continuously connected to, and on an inner side of, the seal-ring antenna.

5. The integrated circuit structure of claim 4, wherein the front-side antenna comprises a portion in the top metallization layer, and extends across a smaller number of the plurality of metallization layers than the seal-ring antenna.

6. The integrated circuit structure of claim 1, wherein the antenna further comprises a backside antenna on a back surface of the semiconductor chip, wherein the backside antenna is electrically connected to the integrated circuit through a through-silicon via.

7. The integrated circuit structure of claim 1 further comprising a reflector between the active circuit and the antenna, wherein the reflector is electrically floating.

8. The integrated circuit structure of claim 1, wherein the seal-ring antenna comprises a top metal line having a thickness greater than about 8 kÅ.

9. The integrated circuit structure of claim 1, wherein the seal-ring antenna has a width of greater than about 2 µm.

10. The integrated circuit structure of claim 1, wherein horizontal spacings between the seal-ring antenna and substantially all integrated circuits in the semiconductor chip are greater than about 2 µm.

11. The integrated circuit structure of claim 1, wherein the seal-ring antenna comprises:
a first metal line;
a second metal line underlying the first metal line; and
redundant vias connecting the first metal line and the second metal line.

12. The integrated circuit structure of claim 11, wherein the redundant vias form an array.

13. The integrated circuit structure of claim 1, wherein the seal-ring antenna comprises:
a first metal line;
a second metal line underlying the first metal line; and
a trench via connecting the first metal line and the second metal line.

14. An integrated circuit structure comprising:
a semiconductor chip comprising a top surface, a bottom surface, and a side surface;
a semiconductor substrate in the semiconductor chip;
an active circuit at a top surface of the semiconductor substrate;
a plurality of metallization layers over the active circuit and the semiconductor substrate, wherein the plurality of metallization layers comprises a top metallization layer and a bottom metallization layer;
an antenna electrically connected to the active circuit, the antenna comprising:
a seal-ring antenna adjacent to the side surface of the semiconductor chip and extending across substantially an entire length of the side surface of the semiconductor chip, wherein substantially no metal features electrically disconnected from the antenna are between the seal-ring antenna and the side surface of the semiconductor chip; and
a front-side antenna on an inner side of the semiconductor chip, wherein the front-side antenna is electrically connected to the seal-ring antenna; and
a conductive reflector between the antenna and the active circuit, wherein the conductive reflector is electrically floating.

15. The integrated circuit structure of claim 14, wherein the front-side antenna has a first bottom higher than a second bottom of the seal-ring antenna.

16. The integrated circuit structure of claim 14, wherein the antenna further comprises an extension on an outer side of the seal-ring antenna, wherein the extension and the front-side antenna extend across a same number of the plurality of metallization layers, and are continuously connected to the seal-ring antenna.

17. The integrated circuit structure of claim 14, wherein the integrated circuit is encircled by a seal ring forming a closed loop, and wherein the antenna is outside of the seal ring.

18. The integrated circuit structure of claim 14, wherein the seal-ring antenna forms a closed loop comprising four edges, each edge adjacent to an edge of the semiconductor chip.

19. The integrated circuit structure of claim 14, wherein the seal-ring antenna comprises a first segment of a seal ring, wherein a second segment of the seal ring is disconnected from the seal-ring antenna, and wherein the seal ring comprises four portions, each portion adjacent a side of the semiconductor chip.

20. The integrated circuit structure of claim 14, wherein the seal-ring antenna comprises first metal lines in the top metallization layer, and is free from second metal lines in the bottom metallization layer.

21. The integrated circuit structure of claim 14, wherein the conductive reflector comprises a first portion blocking a direct signal path between the integrated circuit and the antenna, and wherein the first portion extends across more than one of the plurality of metallization layers.

22. The integrated circuit structure of claim 14, wherein the conductive reflector comprises a first portion comprising a plurality of isolated and electrically floating portions in a same one of the plurality of metallization layers, and wherein the first portion of the conductive reflector is underlying the front-side antenna.

* * * * *